United States Patent
Arnold et al.

(10) Patent No.: US 9,030,841 B2
(45) Date of Patent: May 12, 2015

(54) LOW PROFILE, SPACE EFFICIENT CIRCUIT SHIELDS

(75) Inventors: Shawn X. Arnold, San Jose, CA (US); Scott P. Mullins, Morgan Hill, CA (US); Jeffrey M. Thoma, Mountain View, CA (US); Ramamurthy Chandhrasekhar, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/593,075

(22) Filed: Aug. 23, 2012

(65) Prior Publication Data

US 2013/0223041 A1    Aug. 29, 2013

Related U.S. Application Data

(60) Provisional application No. 61/602,529, filed on Feb. 23, 2012, provisional application No. 61/613,427, filed on Mar. 20, 2012.

(51) Int. Cl.
*H05K 9/00* (2006.01)
*H01L 23/552* (2006.01)
*H01L 23/31* (2006.01)

(52) U.S. Cl.
CPC ..... *H01L 23/552* (2013.01); *H01L 2224/04105* (2013.01); *H01L 2224/12105* (2013.01); *H01L 23/3107* (2013.01)

(58) Field of Classification Search
CPC ............ H05K 9/00; H05K 7/16; H05K 7/20; H01L 23/552; H01L 23/31; H01L 23/48; H01L 21/78
See application file for complete search history.

(56) References Cited

U.S. PATENT DOCUMENTS

| | | | | |
|---|---|---|---|---|
| 5,153,379 A | * | 10/1992 | Guzuk et al. | 174/363 |
| 5,355,016 A | * | 10/1994 | Swirbel et al. | 257/659 |
| 5,557,142 A | * | 9/1996 | Gilmore et al. | 257/659 |
| 5,668,406 A | * | 9/1997 | Egawa | 257/690 |
| 5,864,062 A | * | 1/1999 | Nagahara et al. | 73/514.01 |
| 6,000,968 A | * | 12/1999 | Hagiwara | 439/607.01 |
| 6,150,193 A | * | 11/2000 | Glenn | 438/113 |
| 6,743,975 B2 | * | 6/2004 | Kolb | 174/350 |
| 6,823,747 B2 | * | 11/2004 | Hasegawa et al. | 73/862.52 |
| 7,109,410 B2 | * | 9/2006 | Arnold et al. | 174/390 |
| 7,478,474 B2 | * | 1/2009 | Koga | 29/841 |
| 7,548,430 B1 | * | 6/2009 | Huemoeller et al. | 361/760 |
| 7,618,846 B1 | * | 11/2009 | Pagaila et al. | 438/113 |
| 7,633,765 B1 | * | 12/2009 | Scanlan et al. | 361/760 |
| 8,018,068 B1 | * | 9/2011 | Scanlan et al. | 257/774 |
| 8,072,769 B2 | * | 12/2011 | Ieki et al. | 361/761 |
| 8,084,300 B1 | * | 12/2011 | San Antonio et al. | 438/114 |

(Continued)

OTHER PUBLICATIONS

International Search Report and Written Opinion for PCT application PCT/US2013/027179, dated Jun. 21, 2013.

*Primary Examiner* — Xiaoliang Chen
(74) *Attorney, Agent, or Firm* — Downey Brand LLP

(57) ABSTRACT

A low profile, space efficient circuit shield is disclosed. The shield includes top and bottom metal layers disposed on the top of and below an integrated circuit. In one embodiment the shield can include edge plating arranged to encircle the edges of the integrated circuit and couple the top and bottom metal layers together. In another embodiment, the shield can include through vias arranged to encircle the edges of the integrated circuit and couple the top and bottom metal layers together. In yet another embodiment, passive components can be disposed adjacent to the integrated circuit within the shield.

10 Claims, 9 Drawing Sheets

(56) References Cited

U.S. PATENT DOCUMENTS

| | | | |
|---|---|---|---|
| 8,097,494 B2* | 1/2012 | Tang et al. | 438/114 |
| 8,227,338 B1* | 7/2012 | Scanlan et al. | 438/637 |
| 8,341,835 B1* | 1/2013 | Huemoeller et al. | 29/841 |
| 8,592,958 B2* | 11/2013 | Ko et al. | 257/660 |
| 2001/0015869 A1* | 8/2001 | Kamezawa et al. | 360/97.01 |
| 2002/0168798 A1* | 11/2002 | Glenn et al. | 438/110 |
| 2003/0138991 A1* | 7/2003 | Kung | 438/106 |
| 2003/0169056 A1* | 9/2003 | Hasegawa et al. | 324/661 |
| 2003/0169057 A1* | 9/2003 | Ishiguro et al. | 324/661 |
| 2003/0218257 A1* | 11/2003 | Ishio et al. | 257/781 |
| 2004/0021156 A1* | 2/2004 | Asano et al. | 257/222 |
| 2004/0156172 A1* | 8/2004 | Lin et al. | 361/704 |
| 2004/0178500 A1* | 9/2004 | Usui | 257/734 |
| 2004/0238857 A1* | 12/2004 | Beroz et al. | 257/232 |
| 2004/0252475 A1* | 12/2004 | Tsuneoka et al. | 361/816 |
| 2005/0104164 A1* | 5/2005 | Awujoola et al. | 257/659 |
| 2005/0104165 A1* | 5/2005 | Ishio et al. | 257/659 |
| 2005/0130495 A1* | 6/2005 | Schultz et al. | 439/607 |
| 2006/0148317 A1* | 7/2006 | Akaike et al. | 439/607 |
| 2006/0267159 A1* | 11/2006 | Yamamoto et al. | 257/659 |
| 2007/0023203 A1 | 2/2007 | Goudarzi et al. | |
| 2007/0096160 A1* | 5/2007 | Beroz et al. | 257/232 |
| 2007/0170582 A1* | 7/2007 | Nomura et al. | 257/723 |
| 2007/0200748 A1* | 8/2007 | Hoegerl et al. | 342/85 |
| 2007/0210392 A1* | 9/2007 | Sakakibara et al. | 257/414 |
| 2007/0267725 A1* | 11/2007 | Lee et al. | 257/659 |
| 2008/0210462 A1* | 9/2008 | Kawagishi et al. | 174/377 |
| 2008/0296053 A1* | 12/2008 | Ishimaru et al. | 174/260 |
| 2009/0029506 A1* | 1/2009 | Fujii et al. | 438/127 |
| 2009/0032933 A1* | 2/2009 | Tracht et al. | 257/693 |
| 2009/0072357 A1* | 3/2009 | Tang et al. | 257/659 |
| 2009/0075428 A1* | 3/2009 | Tang et al. | 438/114 |
| 2009/0096041 A1* | 4/2009 | Sakakibara et al. | 257/419 |
| 2009/0115026 A1* | 5/2009 | Gerber et al. | 257/621 |
| 2009/0146269 A1* | 6/2009 | Chow et al. | 257/659 |
| 2009/0152688 A1* | 6/2009 | Do et al. | 257/659 |
| 2009/0236700 A1* | 9/2009 | Moriya | 257/659 |
| 2009/0243012 A1* | 10/2009 | Vanam et al. | 257/432 |
| 2009/0243051 A1* | 10/2009 | Vanam et al. | 257/659 |
| 2009/0302435 A1* | 12/2009 | Pagaila et al. | 257/659 |
| 2009/0315156 A1* | 12/2009 | Harper | 257/660 |
| 2010/0013065 A1* | 1/2010 | Mistry et al. | 257/660 |
| 2010/0019359 A1* | 1/2010 | Pagaila et al. | 257/659 |
| 2010/0027225 A1* | 2/2010 | Yuda et al. | 361/736 |
| 2010/0105171 A1* | 4/2010 | Lee et al. | 438/113 |
| 2010/0109132 A1* | 5/2010 | Ko et al. | 257/660 |
| 2010/0127396 A1* | 5/2010 | Tang | 257/773 |
| 2010/0157566 A1* | 6/2010 | Bogursky et al. | 361/816 |
| 2010/0207258 A1* | 8/2010 | Eun et al. | 257/660 |
| 2010/0267207 A1* | 10/2010 | Tang | 438/124 |
| 2011/0003435 A1* | 1/2011 | Tang et al. | 438/114 |
| 2011/0175210 A1* | 7/2011 | Yao et al. | 257/659 |
| 2011/0176279 A1* | 7/2011 | Zhao et al. | 361/720 |
| 2011/0233736 A1* | 9/2011 | Park et al. | 257/659 |
| 2011/0294261 A1* | 12/2011 | Moriya | 438/112 |
| 2011/0298102 A1* | 12/2011 | Yoo et al. | 257/659 |
| 2011/0304015 A1* | 12/2011 | Kim et al. | 257/532 |
| 2012/0062439 A1* | 3/2012 | Liao et al. | 343/841 |
| 2012/0086109 A1* | 4/2012 | Kim et al. | 257/659 |
| 2012/0098109 A1* | 4/2012 | Ko et al. | 257/659 |
| 2012/0104570 A1* | 5/2012 | Kim | 257/659 |
| 2012/0104573 A1* | 5/2012 | Pagaila et al. | 257/659 |
| 2012/0133032 A1* | 5/2012 | Tsai et al. | 257/659 |
| 2012/0228751 A1* | 9/2012 | Song | 257/660 |
| 2012/0241922 A1* | 9/2012 | Pagaila | 257/659 |
| 2012/0250267 A1* | 10/2012 | Lee et al. | 361/748 |
| 2013/0082364 A1* | 4/2013 | Wang et al. | 257/659 |
| 2013/0087895 A1* | 4/2013 | Upadhyayula et al. | 257/659 |
| 2014/0028518 A1* | 1/2014 | Arnold et al. | 343/841 |

* cited by examiner

Section A-A

LOW PROFILE, SPACE EFFICIENT CIRCUIT SHIELDS

CROSS REFERENCE TO RELATED APPLICATIONS

This application claims priority to U.S. Provisional Patent Application No. 61/602,529, filed Feb. 23, 2012, entitled "LOW PROFILE, SPACE EFFICIENT CIRCUIT SHIELDS," and to U.S. Provisional Patent Application No. 61/613,427, filed Mar. 20, 2012, entitled "LOW PROFILE, SPACE EFFICIENT CIRCUIT SHIELDS," which are incorporated herein by reference in their entireties and for all purposes.

FIELD OF THE DESCRIBED EMBODIMENTS

The described embodiments relate generally to shielding electrical components and more particularly to low-profile, space efficient electrical shields.

BACKGROUND

Electromagnetic interference (EMI) signals can adversely affect the performance and function of electrical devices. Some electrical devices can be sensitive to radiated EMI signals from other devices. For example, a low noise amplifier may provide substantial gain to an input signal; however, the performance of the amplifier may be negatively affected by the presence of interfering EMI signals on the amplifier inputs. The EMI signals can distort or otherwise cause errors in the sensitive input section and as a result the output of the amplifier can become distorted. To protect electrical devices from receiving unintentional EMI radiation, the strength of emitted electromagnetic interference is typically regulated by governmental agencies.

A common device used to control both emission and reception of EMI signals is a metallic shield employed to cover electrical components. The shield protects sensitive electrical parts from receiving stray EMI signals and can also limit the radiation of EMI signals. Shields function by providing a low impedance pathway for EMI signals. Shields are typically constructed of metal, such as steel or, in some instances, can be constructed with conductive paint over an insulator such as plastic.

As described, traditional shield implementations cover one or more electrical components. Unfortunately traditional shield implementations can increase area used on supporting substrates such as a printed circuit board (PCB). Increased area can be due, at least in part, to air gaps commonly used between protected components and the shield. The air gap may ease assembly and installation of the shield on the supporting substrate. As product designs are driven smaller, the areas of related modules such as printed circuit boards are driven to be smaller as well. Thus, there is a desire to decrease the area need to support shield implementations, particularly on supporting substrates such as PCBs.

Therefore, what is desired is space efficient shield assembly to attenuate interfering electrical signals for use on supporting substrates.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Shielding techniques are widely practiced to control the effects of unwanted electromagnetic interference (EMI). Shielding can be used to not only protect sensitive components from absorbing unwanted EMI, but can also be used to prevent unintended emission of EMI signals. Traditional shielding techniques, however, can be bulky and can impose design constraints by requiring excessive area on mounting substrates such as a printed circuit boards.

A low-profile, space efficient integrated shield solution is disclosed. In one embodiment, an integrated circuit is surrounded by top and bottom metal layers and edge plating forming a shield around the integrated circuit. In one embodiment, the shield can be coupled to a signal shared with the integrated circuit. In another embodiment, the shield can be isolated from the integrated circuit. For example the shield can be coupled to a signal separate from the signal coupled to the integrated circuit. In certain embodiments the separate signal is ground signal. In yet another embodiment, the edge plating can be replaced with through vias that both couple the top and bottom metal layers and also act as an edge shield. In still another embodiment, passive components can be included within the shield with the integrated circuit.

Figure 1:
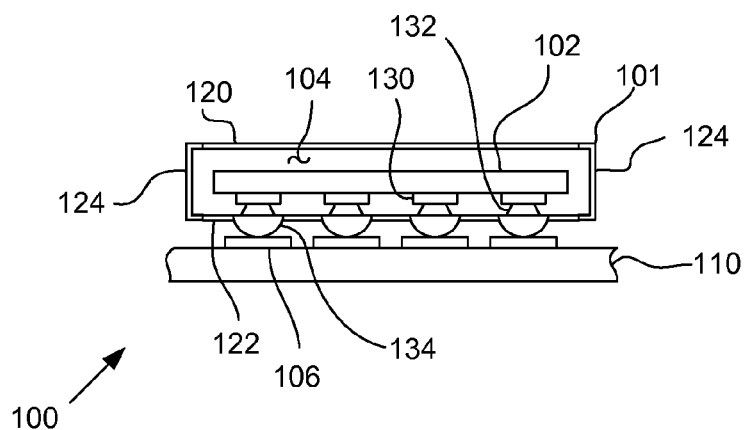
FIG. 1 is a simplified diagram of one embodiment of a small form factor shield system.

FIG. 1 is a simplified diagram of one embodiment small form factor shield system 100 in accordance with the specification. The shield system 100 can include integrated circuit 102 and substrate 110. Substrate 110 can be a printed circuit board, flex circuit or other technically feasible material. In one embodiment, integrated circuit 102 can be embedded within a suitable matrix 104 such as a resin, fiberglass, epoxy or other insulative material. In one embodiment, integrated circuit 102 can be a ball grid array, CSP, PLCC or other feasible integrated circuit package.

Integrated circuit 102 or the combination of integrated circuit 102 and matrix 104 can be effectively wrapped with a shield. In one embodiment, shield 101 can include shield top 120, shield bottom 122 and shield edge plating 124. Shield 101 can be formed out of thin metal foil such as copper, aluminum, steel or other suitable material. By attaching shield 101 directly to integrated circuit 102 (or integrated circuit 102 and matrix 104 combination), substantial area can be saved on substrate 110 because the combination of shield 101 and integrated circuit 102 need not require much more surface area than integrated circuit 102 alone. In some embodiments shield 101 can be formed from metal foil, only a few microns thick. For example, the foil can range from 10 microns to 100 microns thick. Differing foil thicknesses can attenuate differing EMI frequencies. In one embodiment, the foil thickness can be selected to reduce a particular target frequency. In another embodiment, the foil thickness can be selected to increase or decrease an amount of EMI attenuation.

Integrated circuit 102 signals can be coupled through terminals 130, laser vias 132 and bumps 134. In one embodiment, laser vias 132 are formed before shield 101 is formed. That is, shield 101 is formed to have openings therein corresponding to the locations of laser vias 132. In one embodiment bumps 134 can be balls, solder balls or other suitable feature allowing the coupling of signals to pads 106. In one embodiment, shield 101 can be coupled to one or more bumps 134 shared in common with integrated circuit 102. In this way, when bump 134 is coupled to ground, then shield 101 is also coupled to ground. This arrangement can reduce or eliminate the need for dedicated pads needed to support shield signal coupling. In one embodiment, shield 101 can be used as a contact point or support point for other components such as a flex circuit. For example, when shield 101 is coupled to ground, then a separate flex circuit can couple a flex circuit ground signal to shield 101.

Figure 2:
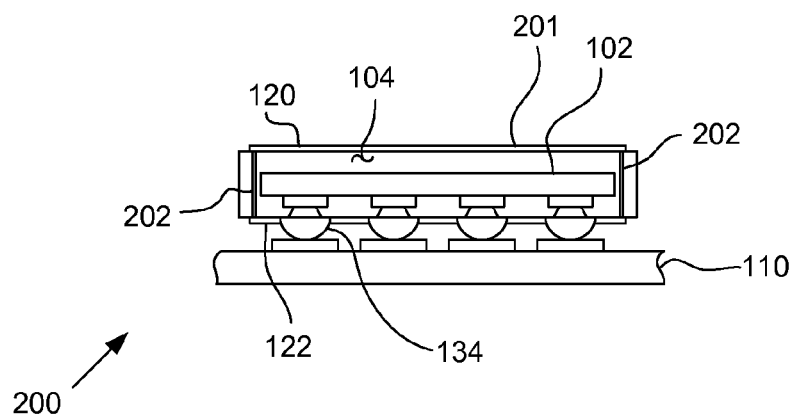
FIG. 2 is a simplified diagram of another embodiment of a small form factor shield system.

FIG. 2 is a simplified diagram of another embodiment a small form factor shield system 200 in accordance with the specification. Similar to FIG. 1, this embodiment includes an integrated circuit 102 within a matrix 104 mounted on a substrate 110. Shield top 120 and shield bottom 122 can be disposed above and below and in contact with matrix 104. Through vias 202 can couple shield top 120 to shield bottom 122. Though vias 202 can be placed around the perimeter of integrated circuit 102 and replace the need for edge plating 124. Thus, shield 201 can include shield top 120, shield bottom 122 and through vias 202. Shield 201 can be coupled to bump 134 as described in FIG. 1 to connect shield 201 to a ground signal already used by integrated circuit 102. In one embodiment, matrix 104 can support two or more sub-layers, similar to printed circuit board designs. Through vias 202 can be stacked vertically to couple shield top 120 to shield bottom 122 through sub-layers within matrix 104.

Figure 3:
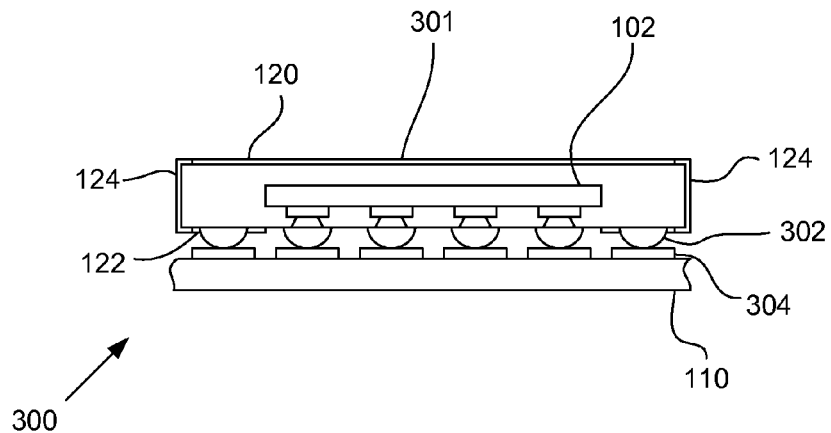
FIG. 3 is a simplified diagram of yet another embodiment of a small form factor shield system.

FIG. 3 is a simplified diagram of yet another embodiment of a small form factor shield system 300 in accordance with the specification. The shield system 300 includes integrated circuit 102 and substrate 110 as described above in FIG. 2. Shield 301 can include shield top 120, shield bottom 122 and edge plating 124. In this embodiment, shield 301 can be isolated with respect to other signals that can be coupled to integrated circuit 102. As shown, shield 301 can be coupled to a dedicated bump 302. In turn, bump 302 can be coupled to a signal through pad 304 on substrate 110. This signaling arrangement enables shield 301 to be coupled to isolated signals with respect to the integrated circuit 102. For example, integrated circuit may use a local voltage reference such as analog ground, while shield 301 can be coupled to a different signal such as digital ground.

Figure 4:
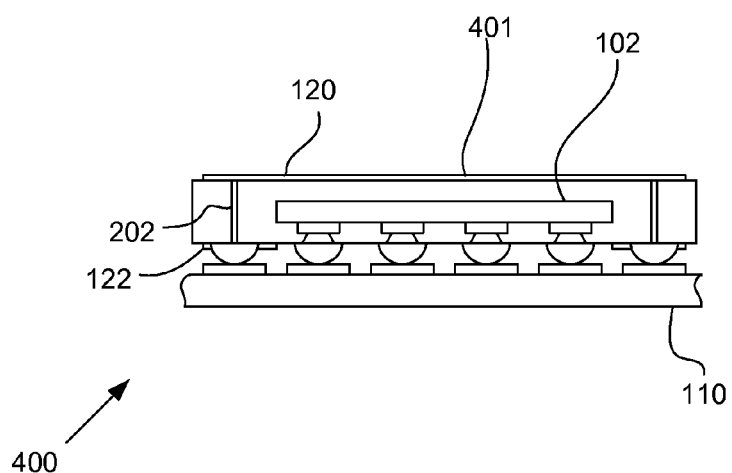
FIG. 4 is a simplified diagram of still another embodiment of a small form factor shield system.

FIG. 4 is a simplified diagram of still another embodiment of a small form factor shield system 400 in accordance with the specification. Shield system 400 can include integrated circuit 102 and substrate 110 as described above. Shield top 120 and shield bottom 122 are again placed above and below the integrated circuit 102. In this embodiment, instead of using edge plating 124, through vias 202 are used to couple shield top 120 to shield bottom 122. Thus, shield 401 can include shield top 120, shield bottom 122 and through vias 202. As described in FIG. 3, shield 401 can be isolated with respect to other signals that can be coupled to integrated circuit 102. Thus, shield 401 can be coupled to isolated signals with respect to integrated circuit 102.

Figure 5:
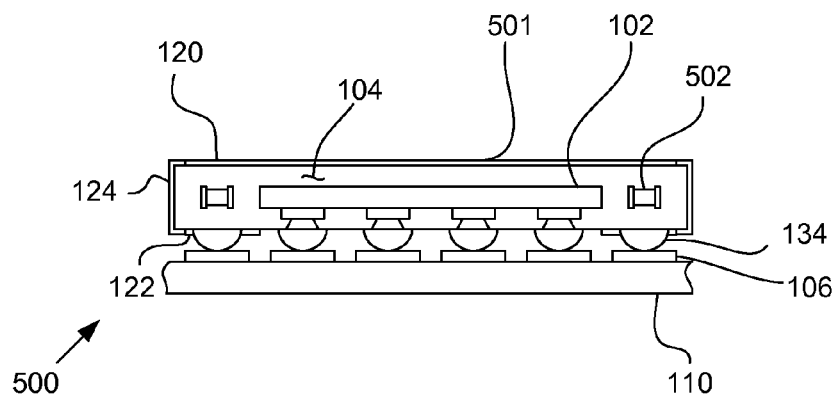
FIG. 5 is a simplified diagram of another embodiment of a small form factor shield system.

FIG. 5 is a simplified diagram of another embodiment of a small form factor shield system 500 in accordance with the specification. Shield system 500 includes integrated circuit 102 and substrate 110. Shield 501 can include shield top, 120, shield bottom 122 and edge plating 124. In this embodiment, the volume enclosed by the shield 501 can be increased relative to the size of integrated circuit 102. The increase in volume can support one or more passive components 502 that can also be embedded in matrix 104. A passive component can be a resistor, capacitor, inductor or the like. In one embodiment, signals can be coupled between integrated circuit 102 and passive component 502. For example, passive component 502 can be a bus termination resistor that can be coupled to integrated circuit 102. In one embodiment, shield 501 can be isolated from other signals going to or coming from integrated circuit 102 as described in FIG. 3. In another embodiment, shield 501 can be coupled to bump 134 that can be shared with integrated circuit 102.

Figure 6:
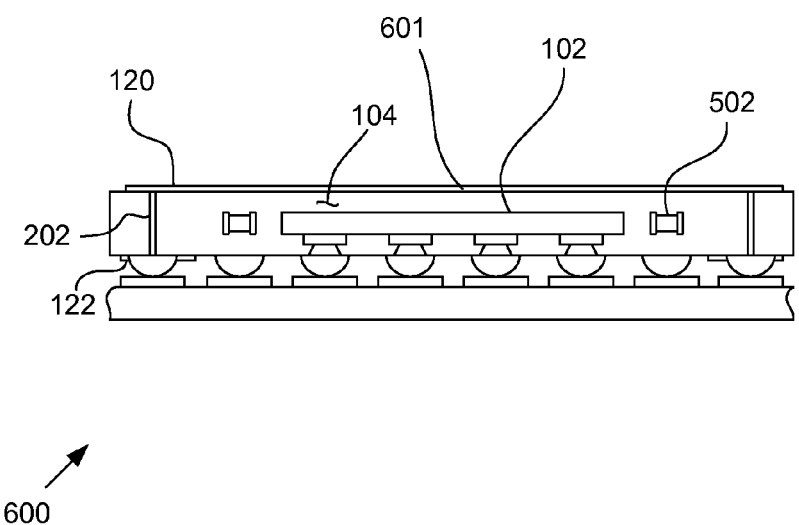
FIG. 6 is simplified diagram of yet another embodiment of a small form factor shield system.

FIG. 6 is simplified diagram of yet another embodiment of a small form factor shield system 600 in accordance with the specification. Shield 601 can include shield top 120, shield bottom 122 and through vias 202. The volume enclosed by shield 601 and the volume of matrix 104 can be increased to allow one or more passive components 502 to be embedded with integrated circuit 102. In one embodiment, shield 601 can be isolated from other signals going to or coming from integrated circuit 202. In another embodiment, shield 601 can be coupled to at least one signal going to or coming from integrated circuit 102. In one embodiment, signals can be coupled between passive component 502 and integrated circuit 102.

Figure 7:
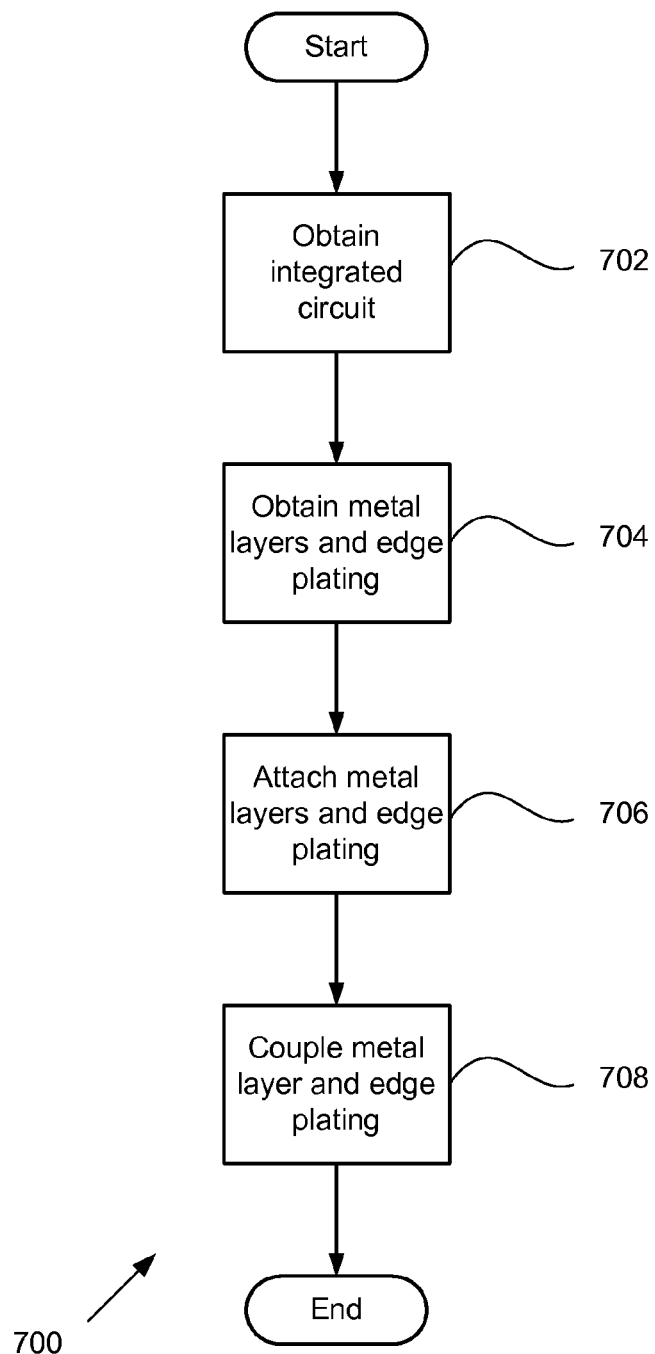
FIG. 7 is a flow chart of method steps for forming a low profile, space efficient EMI shield.

FIG. 7 is a flow chart of method steps 700 for forming a low profile, space efficient EMI shield. Persons skilled in the art will appreciate that any system executing the following steps in any order is within the scope of the disclosed method steps. The method begins in step 702 where an integrated circuit 102 is obtained. In one embodiment, integrated circuit 102 can include solder bumps. In other embodiments, integrated circuit 102 can include solder balls or other similar features. In step 704, metal components for the EMI shield are obtained. In one embodiment, metal components can include shield top 120 and shield bottom 122 as well as edge plating 124 can be obtained. In step 706, metal components are attached to integrated circuit 102. In one embodiment, integrated circuit 102 can be embedded within matrix 104; therefore, metal components can be attached to matrix 104. In step 708, metal components can be coupled together to form the EMI shield and the method ends.

Figure 8:
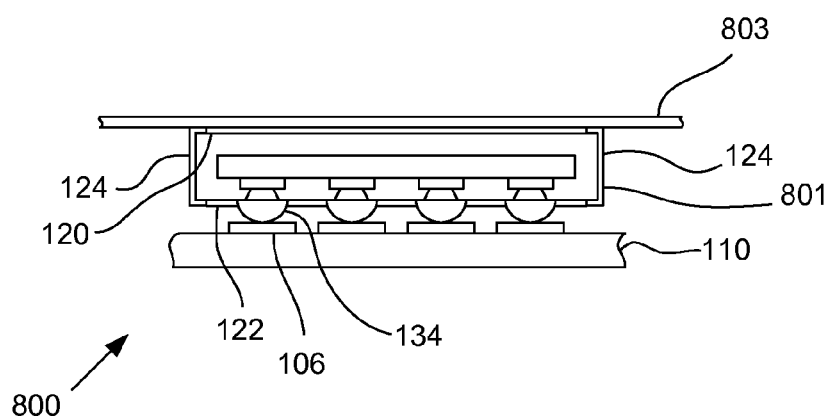
FIG. 8 is a diagram of a low profile shield system supporting a flex circuit.

FIG. 8 is a diagram of a low profile shield system 800 supporting a flex circuit. Shield 801 can include shield top 120, shield bottom 122 and edge plating 124. Shield 801 can be coupled to bump 134. Bump 134 can be coupled to a signal through pad 106, thereby coupling shield 801 to the signal on pad 106. In one embodiment, the signal on pad 106 can be a ground signal, thus shield 801 can be coupled to the ground signal. Flex circuit 803 can be configured to couple at least one signal to shield 801. In one embodiment, flex circuit 803 can be disposed on, and in direct contact with shield 801. In one embodiment, flex circuit 803 can be attached with a conductive adhesive to shield 801 coupling an exposed trace or wire within flex circuit 803 to shield 801. In one embodiment, when shield 801 is coupled to ground, one or more signals in flex circuit 803 can also be coupled to ground. For example, flex circuit may include a ground plane that can be coupled to ground through shield 801.

Figure 9A:
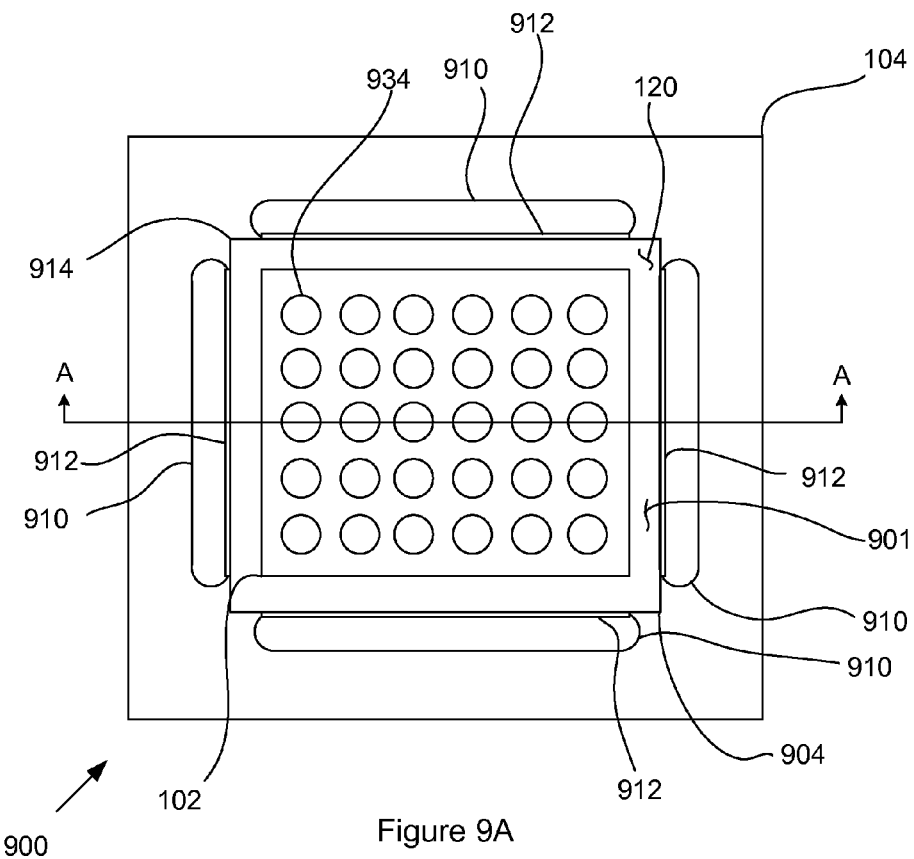
FIGS. 9A and 9B illustrate two views of a low profile shield assembly.
Figure 9B:
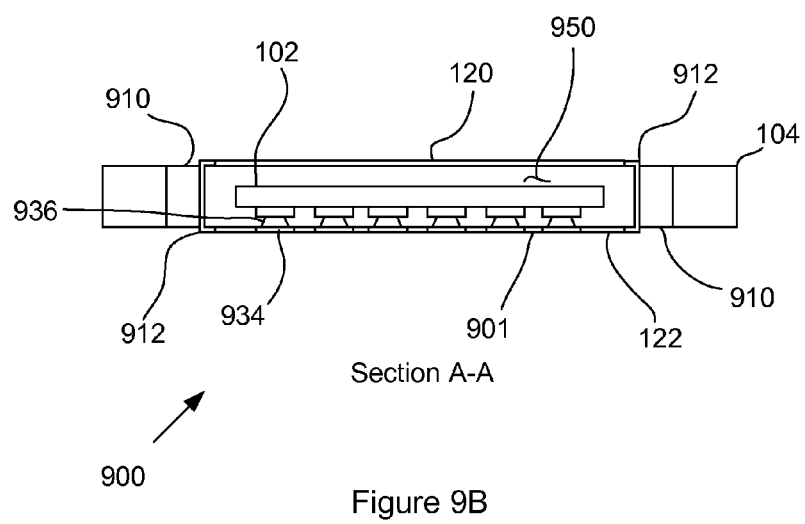

FIGS. 9A and 9B illustrate two views of a low profile shield assembly 900. FIG. 9A shows assembly 900 from a top view. In this embodiment, integrated circuit 102 is embedded in matrix 104 to form a low profile shield system 914. The initial size of matrix 104, however, can be larger than the finished dimension of the shield system 914. The shield system 914 can include embedded integrated circuit 102 surrounded by shield 901 which can include edge plating 912 and shield top 120 and shield bottom (not shown). In one embodiment, matrix 104 can act as a carrier for the integrated circuit 102 and shield 901. Matrix 104, thusly configured, can enable easier assembly, handling and manufacturing of shield system 914.

In one embodiment shield top 120 can receive a solder mask. The solder mask can resist solder especially as shield system 914 may be attached to a circuit board though a flow or re-flow soldering technique. In another embodiment, at least a portion of shield top 120 can be free from a solder mask to allow the attaching of a heat sink, heat pipe or other thermal conductive solution. In one embodiment, matrix 104 can be minimized over integrated circuit 102 in area 950 to help increase thermal transfer from integrated circuit 102.

FIG. 9A also shows pads 934 for coupling signals to integrated circuit 102 and shield 901. Pads 934 can couple signals through laser vias 936 to integrated circuit 102. In one embodiment, shield system 914 can include 30 pads. Other embodiments can include more or few bumps as may be required to support integrated circuit 102. Note that shield bottom 122 can exist between pads 934 to enhance shield 901 performance. Matrix 104 can include routed areas 910. Routed areas 910 can enable edge plating 912 to be applied while the shield system 914 is still mounted in matrix 104 (acting as a carrier). Routed areas 910 can be formed with a router, laser drill or with any other technically feasible approach. Edge plating 912 can be applied through routed areas 910 and can couple shield top 120 and shield bottom 122 to form shield 901. In one embodiment, to separate shield system 914 from excess portions of matrix 104, lines can be scored around the perimeter of shield system 914. In another embodiment, shield system 914 can be separated from excess portions of matrix 914 with a laser or any other similar approach.

FIG. 9B shows a side view of assembly 900. Integrated circuit 102 is embedded in matrix 104 and effectively surrounded by shield 901. As shown, shield 901 can include shield top 120, shield bottom 122 and edge plating 912 as applied through routed areas 910. Pads 934 can couple signals to integrated circuit 102. FIG. 9B also shows excess portions of matrix 104 beyond shield 901. These portions of matrix 104 can be removed prior to mounting shield system 914 onto a circuit board, for example. Other embodiments can include different integrated circuit 102 heights and different shield system 914 heights. In one embodiment, shield 914 can share a signal, such as a ground signal with integrated circuit 102. This arrangement was described earlier in conjunction with FIG. 1. In another embodiment, shield 914 can be isolated from signals used by integrated circuit 102 and be coupled to an independent signal such as chassis ground. This arrangement was described earlier in conjunction with FIG. 3.

Figure 9C:
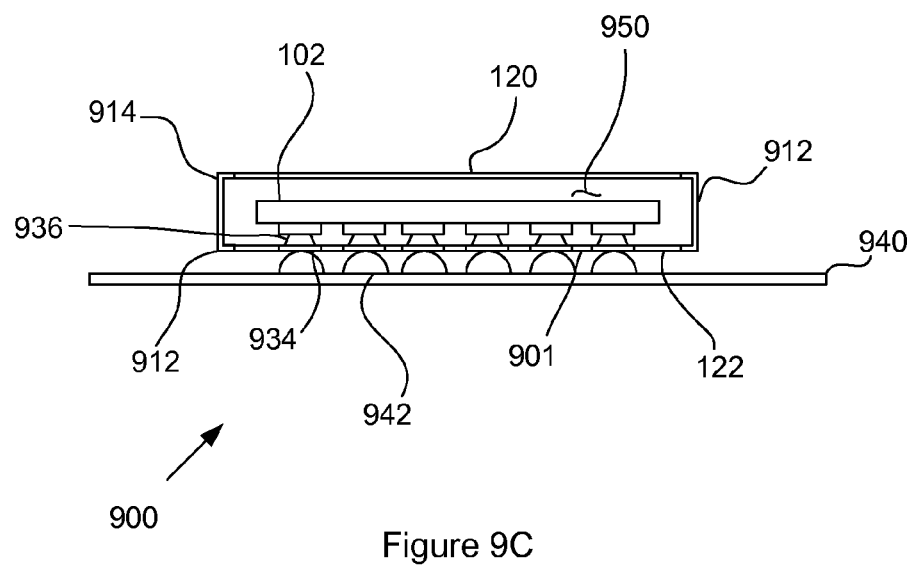

FIG. 9C illustrates a side view of assembly 900 of FIGS. 9A and 9b after excess portions of matrix 104 are removed. Any suitable method can be used to remove excess portions of matrix 104. In one embodiment, a router is used to route the excess portions of matrix 104 away from the shield system 914. In another embodiment, excess portion of matrix 104 are scored near the shield system 914 and subsequently broken off. In other embodiments, a laser cutting device is used to cut away excess portion of matrix 104. After excess portions of matrix 104 are removed, shield system 914 can be mounted onto a circuit board 940, for example. Circuit board 940 can be a printed circuit board, flex circuit or other suitable structure. Solder balls 942 can be aligned with pads 934 such that signals can be coupled from circuit board 940 to integrated circuit 102.

Figure 10:
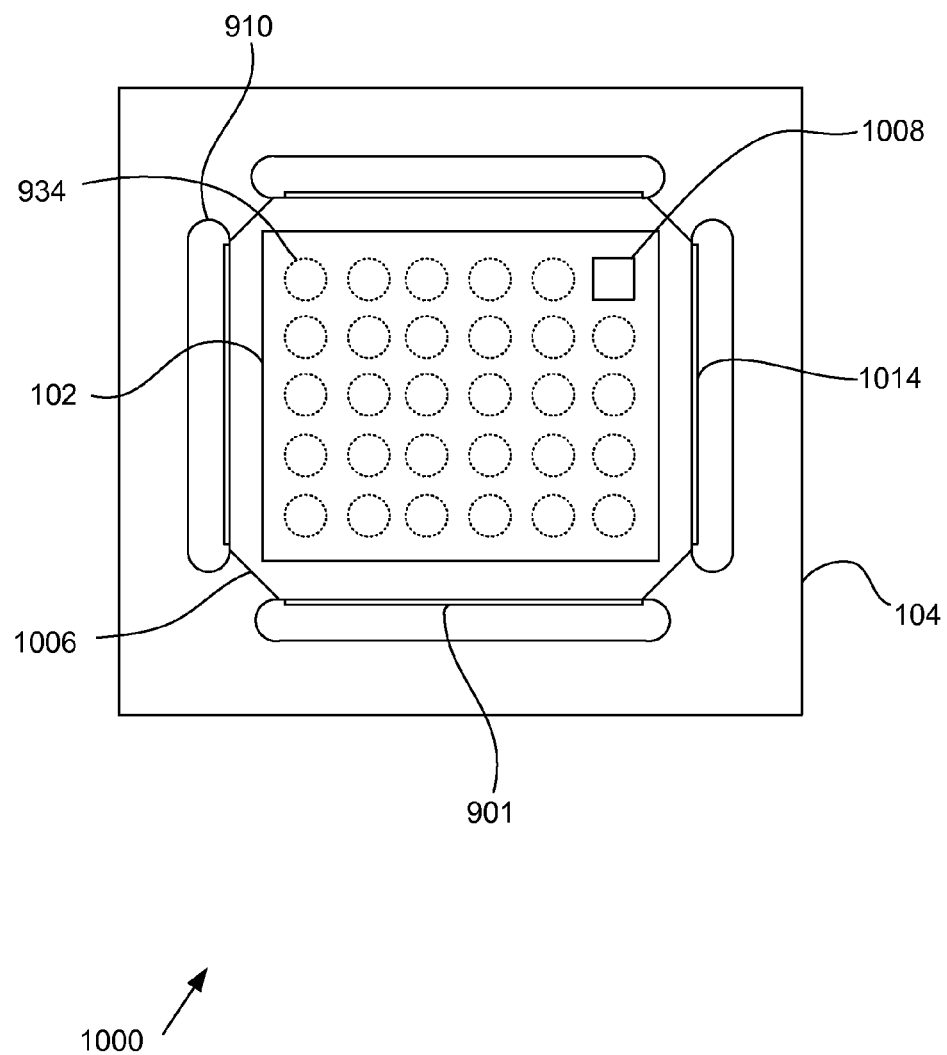
FIG. 10 illustrates another embodiment of a low profile shield assembly.

FIG. 10 illustrates another embodiment of a low profile shield assembly 1000. In this embodiment, shield system 1014 can include integrated circuit 102 embedded in matrix 104. In contrast to shield system 914 in FIG. 9, corners of shield system 1014 can be chamfered 1006 at 45 degrees. Chamfers 1006 can help increase the amount of other components that can be mounted on a circuit board along side shield system 1014. Chamfers 1006 can be formed as a later step after integrated circuit 102 is embedded in matrix 104 and after shield 901 is formed and attached. In one embodiment, chamfers 1006 can be formed by a router. In another embodiment, chamfers 1006 can be formed by scoring matrix 104 to enable easy separation. In still another embodiment, chamfers 1006 can be formed by a laser cutting device.

Pads 934 are on the far side of shield system 1014 (as in FIG. 9A) and are shown here with dashed lines. A pin A1 indicator 1008 can be applied to the near side of shield system 1014 (and over pad A1) and can help orient shield system 1014 for proper assembly onto a circuit board, for example.

Figure 11:
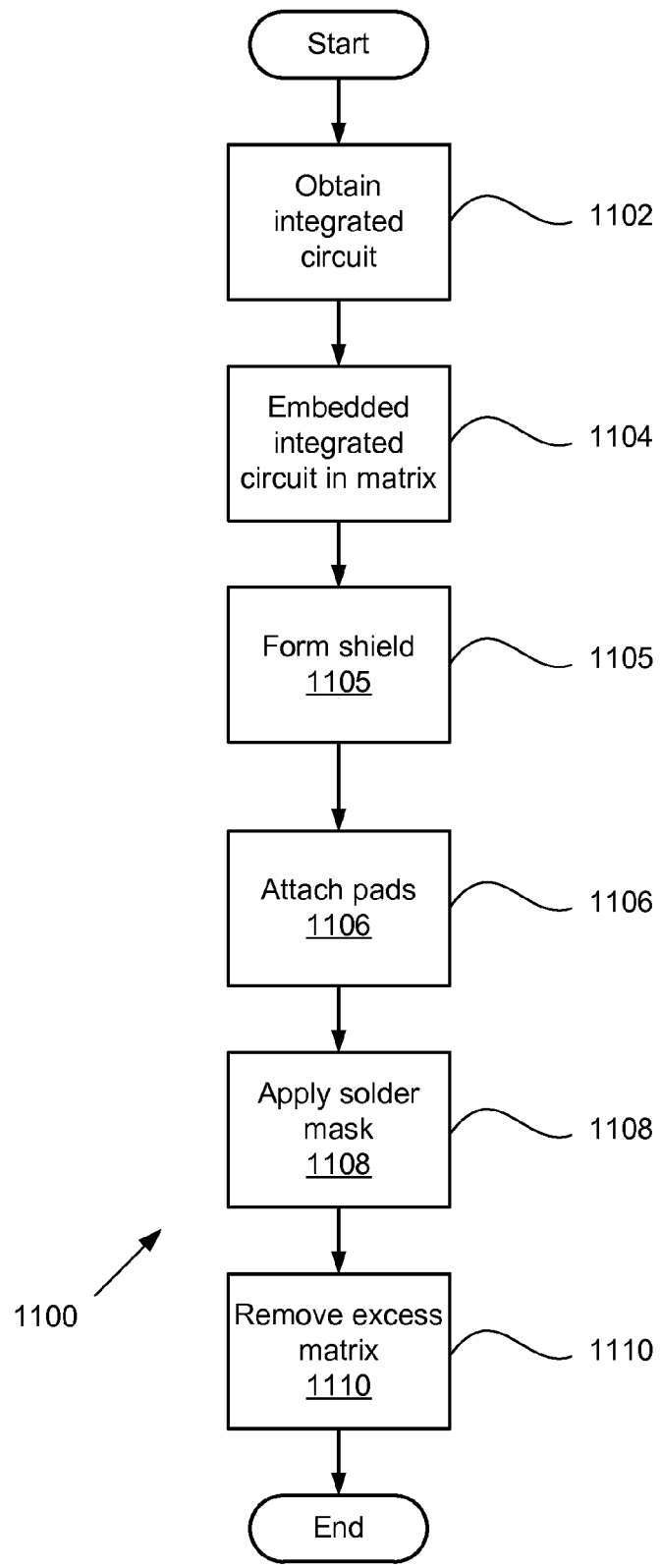
FIG. 11 is a flow chart of method steps for forming shield system.

FIG. 11 is a flow chart of method steps 1100 for forming shield system 914. The method begins in step 1102 where integrated circuit 102 is obtained. In step 1104, integrated circuit 102 is embedded in matrix 104. In one embodiment, matrix 104 can be larger than the finished dimension of shield system 914. Step 1104 can include the forming of routed areas 910 into matrix 104. In step 1105 shield 901 can be formed to surround integrated circuit 102. In one embodiment, shield 901 can include shield top 120, shield bottom 122 and edge plating 912 applied through routed areas 910. In step 1106 pads 934 can be attached to matrix 104 to couple signals to integrated circuit 102. In one embodiment, laser vias can be formed to help couple signals from integrated circuit 102 to pads 934. In step 1108, a solder mask can be preferentially applied to shield top 120. In one embodiment, portions of shield top 120 can be left without solder mask to enable attachment of a heat sink, heat pipe or other like thermal conducting device. In step 1110 excess matrix 104 can be removed. In one embodiment, excess matrix 104 can be the portion of matrix 104 that extends beyond the finished dimension of shield system 914.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A small form factor shield device, comprising:
   an integrated circuit assembly, comprising:
      an integrated circuit, comprising at least two conductive contact pads, and
      a matrix formed of insulative material that fully encapsulates the integrated circuit; and
   a conformable electromagnetic interference (EMI) shield formed of a flexible conductor wrapped directly around at least a top and a bottom portion of the integrated circuit assembly and configured to conform to a shape of the top and bottom portion of the integrated circuit assembly such that the wrapped integrated circuit assembly comprising the conformable EMI shield and the integrated circuit assembly is substantially the same size as the integrated circuit assembly alone;
   a flexible circuit coupled with the conformable EMI shield and comprising electrically conductive pathways separate and distinct from each other, at least one of the electrically conductive pathways being electrically coupled with and grounded through the conformable EMI shield; and
   vias disposed around a periphery of the integrated circuit, each of the vias embedded within the matrix and extending from the top portion of the matrix to the bottom portion of the matrix, thereby electrically coupling a first portion of the conformable EMI shield disposed along the top portion to a second portion of the conformable EMI shield disposed along the bottom portion.

2. The small form factor shield device as recited in claim 1, wherein the plurality of vias cooperate to prevent EMI from escaping unshielded lateral portions of the integrated circuit assembly.

3. The small form factor shield device as recited in claim 1, wherein the small form factor shield device is surface mounted to a printed circuit board.

4. The small form factor shield device as recited in claim 1, further comprising a conductive edge plating creating an additional electrically conductive pathway between the top and bottom portions of the conformable EMI shield.

5. The small form factor shield device as recited in claim 1, wherein the conformable EMI shield is electrically coupled with the integrated circuit.

6. The small form factor shield device as recited in claim 1, wherein the conformable EMI shield is configured to be grounded through a grounding path separate and distinct from electrically conductive pathways associated with the integrated circuit.

7. The small form factor shield device as recited in claim 1, further comprising at least one passive component embedded in the matrix.

8. The small form factor shield device as recited in claim 7, wherein the at least one passive component is one of a resistor, capacitor or inductor.

9. The small form factor shield device as recited in claim 1, wherein the conformable shield comprises a sheet of metal foil between 10-100 microns thick.

10. The small form factor shield device as recited in claim 1, wherein the matrix has a rectangular geometry with chamfered corners, the chamfered corners increasing an amount of other components that can be mounted on a circuit board along side the small form factor shield device.

* * * * *